United States Patent
Yu

(10) Patent No.: US 9,217,197 B2
(45) Date of Patent: Dec. 22, 2015

(54) METHODS FOR DEPOSITING A LAYER ON A SUBSTRATE USING SURFACE ENERGY MODULATION

(75) Inventor: Jick M. Yu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 254 days.

(21) Appl. No.: 13/031,402

(22) Filed: Feb. 21, 2011

(65) Prior Publication Data

US 2011/0209982 A1  Sep. 1, 2011

Related U.S. Application Data

(60) Provisional application No. 61/308,651, filed on Feb. 26, 2010.

(51) Int. Cl.

| | |
|---|---|
| C23C 14/00 | (2006.01) |
| C23C 14/34 | (2006.01) |
| C23C 14/04 | (2006.01) |
| C23C 14/18 | (2006.01) |
| C23C 14/58 | (2006.01) |
| H01J 37/32 | (2006.01) |
| H01J 37/34 | (2006.01) |
| C23C 14/14 | (2006.01) |

(52) U.S. Cl.
CPC ............. *C23C 14/345* (2013.01); *C23C 14/046* (2013.01); *C23C 14/185* (2013.01); *C23C 14/3471* (2013.01); *C23C 14/5806* (2013.01); *H01J 37/321* (2013.01); *H01J 37/3408* (2013.01); *C23C 14/0057* (2013.01); *C23C 14/14* (2013.01)

(58) Field of Classification Search
CPC .... C23C 14/046; C23C 14/14; C23C 14/0057
See application file for complete search history.

(56) References Cited

U.S. PATENT DOCUMENTS

| 6,500,315 | B1* | 12/2002 | Arunachalam et al. .. 204/192.12 |
| 6,887,786 | B2 | 5/2005 | Zhang et al. |
| 2005/0056536 | A1* | 3/2005 | Gopalraja et al. ....... 204/192.12 |
| 2005/0199489 | A1* | 9/2005 | Stevens et al. ............. 204/275.1 |
| 2006/0169578 | A1* | 8/2006 | Brown et al. ............ 204/192.15 |

(Continued)

OTHER PUBLICATIONS

J. Ruzyllo, "Semiconductor Glossary" http://web.archive.org/web/20091009115906/http://www.semi1source.com/glossary/default.asp?searchterm=capping+layer.*

(Continued)

*Primary Examiner* — Keith Hendricks
*Assistant Examiner* — Timon Wanga
(74) *Attorney, Agent, or Firm* — Moser Taboada; Alan Taboada

(57) ABSTRACT

Methods for depositing layers on substrates are provided herein. In some embodiments, a method of forming a layer on a substrate having at least one feature disposed therein includes forming a conformal layer on an upper surface of the substrate and within the at least one feature by sputtering a target material using a first plasma that reduces the surface energy of the target material such that the sputtered target material wets the upper surface of the substrate and the at least one feature to form the conformal layer; and filling at least a portion of the at least one feature by sputtering the target material using a second plasma different from the first plasma to increase the surface energy of the sputtered target material and the conformal layer such that at least portions of the conformal layer are pulled into the at least one feature by capillary action.

18 Claims, 5 Drawing Sheets

(56) References Cited

U.S. PATENT DOCUMENTS

2008/0173536 A1* 7/2008 Ramm et al. ............. 204/192.12
2009/0227105 A1* 9/2009 Fu et al. ........................ 438/653

OTHER PUBLICATIONS

Miyake et al., "Atomic Hydrogen Enhanced Reflow of Copper", Appl. Phys. Lett. 70 (10), Mar. 10, 1997, pp. 1239-1241.

Kwon et al., "Comparison of the Agglomeration Behavior of Au and Cu Films Sputter Deposited on Silicon Dioxide", Journal of Applied Physics, vol. 93, No. 6, Mar. 15, 2003, pp. 3270-3278.

Ooka et al., "Effect of $H_2$ Addition during Cu Thin-Film Sputtering", Japanese Journal of Applied Physics, vol. 45, No. 12, 2006, pp. 9058-9062.

* cited by examiner

METHODS FOR DEPOSITING A LAYER ON A SUBSTRATE USING SURFACE ENERGY MODULATION

CROSS-REFERENCE TO RELATED APPLICATIONS

This application claims benefit of U.S. provisional patent application Ser. No. 61/308,651, filed Feb. 26, 2010, which is herein incorporated by reference

FIELD

Embodiments of the present invention generally relate to methods for depositing a layer on a substrate

BACKGROUND

Conductive materials, for example, metals such as copper have a high surface energy. Consequently, when depositing these conductive materials at high temperatures (e.g., about 100 degrees Celsius or greater), for example, using physical vapor deposition (PVD) or similar techniques, the conductive materials tend to agglomerate on a surface of a substrate and/or fail to fill a feature formed in a surface of a substrate because of the high surface energy of the conductive materials. Some solutions for this wetting problem include depositing a wetting layer to provide a lower interfacial energy between the conductive materials and the wetting layer on which the conductive materials are deposited than would otherwise be present if the conductive materials were deposited directly onto the surface of the substrate. Unfortunately, the inventors have discovered that such wetting layers can undesirably result in higher resistivity and/or lower surface diffusion rates of the conductive materials.

Accordingly, the inventors have provided improved methods for depositing conductive materials on a substrate.

SUMMARY

Methods for depositing a layer on a substrate are provided herein. In some embodiments, a method of forming a layer on a substrate having at least one feature disposed in an upper surface of the substrate may include forming a conformal layer on an upper surface of the substrate and interior surfaces of the at least one feature by sputtering a target material using a first plasma that reduces the surface energy of the target material such that the sputtered target material wets the upper surface of the substrate and the interior surfaces of the at least one feature to form the conformal layer; and filling at least a portion of the at least one feature by sputtering the target material using a second plasma different from the first plasma to form a deposited layer, wherein the second plasma interacts with the sputtered target material and the deposited conformal layer to increase the surface energy of the sputtered target material and the conformal layer such that at least portions of the conformal layer are pulled into the at least one feature by capillary action. In some embodiments, the first plasma may be formed from a first process gas comprising a first concentration of hydrogen ($H_2$), and the second plasma may be formed from a second process gas comprising a second concentration of hydrogen ($H_2$) different from the first concentration. In some embodiments, forming and filling may be sequentially repeated to completely fill the feature.

In some embodiments, a method of forming a layer on a substrate may include pre-treating the substrate with a pre-treatment gas comprising hydrogen ($H_2$); and sputtering a target material using a plasma formed from a process gas comprising hydrogen ($H_2$) to deposit the target material on the pre-treated substrate to form a layer from the target material. In some embodiments, the method may include co-flowing an inert gas with the pre-treatment gas upon completion of the pre-treatment of the substrate to form the process gas.

In some embodiments, a method of forming a layer on a substrate may include sputtering a target material using a plasma comprising an inert gas to form a deposited layer from the target material on the substrate; providing hydrogen ($H_2$) to the plasma while sputtering the target material and forming the deposited layer on the substrate; and heating the substrate to a temperature ranging from about 100 to about 400 degrees Celsius while providing hydrogen ($H_2$) to the plasma to anneal the deposited layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
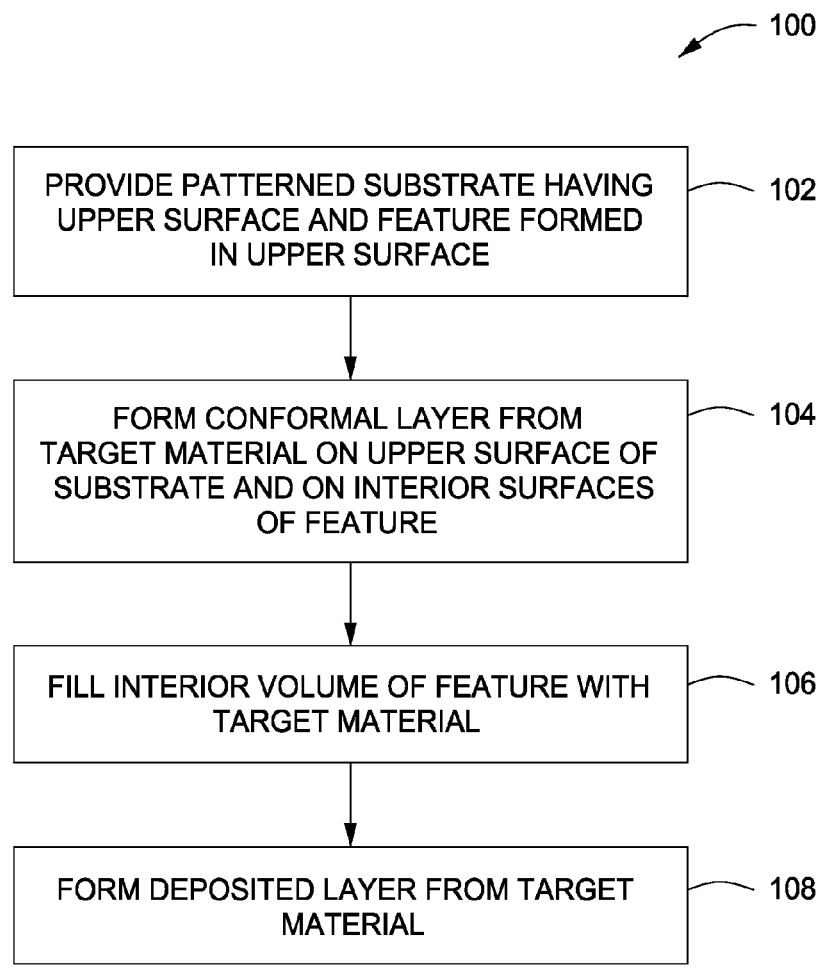
FIG. 1 depicts a flow chart for a method of forming a layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming layers on a substrate are discussed herein. The inventive methods advantageously control the surface energy of a material to be deposited, such as a metal or metal alloy, such that the deposited material wets the surface and/or fills a feature formed in the surface of the substrate at lower temperatures and at faster rates as compared to conventional processes.

FIG. 1 depicts a flow chart for a method 100 of forming a layer on a substrate in accordance with some embodiments of the present invention. The method 100 is described below in accordance to the stages of fabrication for forming a layer on a substrate as illustrated in FIGS. 2A-D.

Figure 2A:
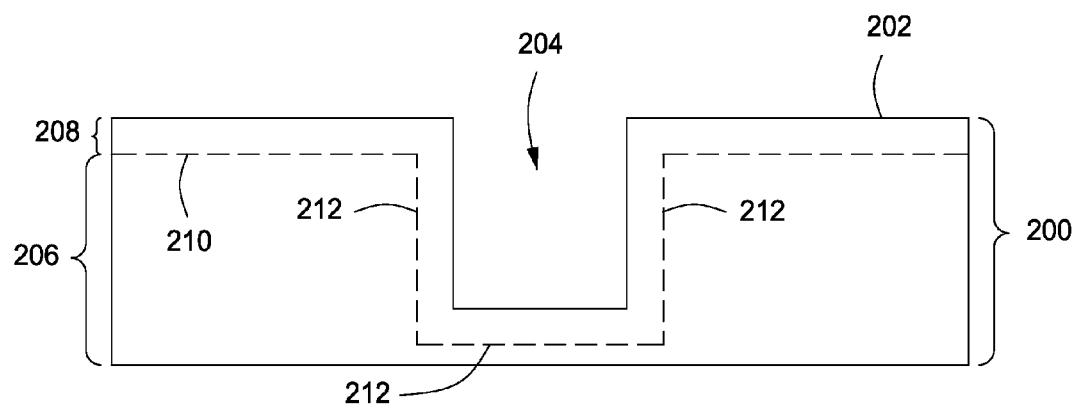
FIGS. 2A-D depict the stages of fabrication for a layer formed by the method depicted in FIG. 1.

The method 100 begins at 102 by providing a patterned substrate 200 having an upper surface 202 and at least one feature 204 formed in the upper surface 202 of the patterned substrate 200, as illustrated in FIG. 2A.

The patterned substrate that may be any suitable material to be processed, such as a crystalline silicon (e.g., Si<100> or Si<111>), a silicon oxide, a strained silicon, a silicon germanium, a doped or undoped polysilicon, a doped or undoped silicon wafers, patterned or non-patterned wafers, silicon on insulator (SOI), carbon doped silicon oxides, silicon nitride, doped silicon, germanium, gallium arsenide, glass, sapphire, a display substrate (such as a liquid crystal display (LCD), a plasma display, an electro luminescence (EL) lamp display, or the like), a solar cell array substrate, a light emitting diode (LED) substrate, or the like. The substrate may have various dimensions, such as 200 mm or 300 mm diameter wafers, as well as rectangular or square panels.

For example, in some embodiments, the patterned substrate 200 may include a first layer 206 having the at least one feature 204 disposed therein. In some embodiments, a conformal second layer 208 may be formed atop an upper surface 210 of the first layer 206 and along interior surfaces 212 of the at least one feature 204. Additional patterned or unpatterned layers may be disposed on the substrate beneath the first layer 206. The first layer 206 may be any suitable material to be processed, for example, such as any of the materials discussed above for the patterned substrate 200. The conformal second layer 208 may be a barrier layer, for example, formed from suitable conductive materials, such as tantalum (Ta), tantalum nitride (TaN), titanium nitride (TiN), cobalt (Co), alloys thereof, combinations thereof, or the like.

The at least one feature 204 may be one or more of a trench, a via, a channel, a well, a dual damascene structure, or the like. One or more of the at least one feature 204 may have a critical dimension (CD), for example, such as a horizontal gap in the at least one feature 204, of less than about 40 nanometers, or in some embodiments, about 3 nanometers, or about 1 to about 3 nanometers, or about 1.5 nanometers. In some embodiments, one or more of the at least one feature 204 may have an aspect ratio (of height to width) of about 3:1 to about 4:1.

Figure 2B:
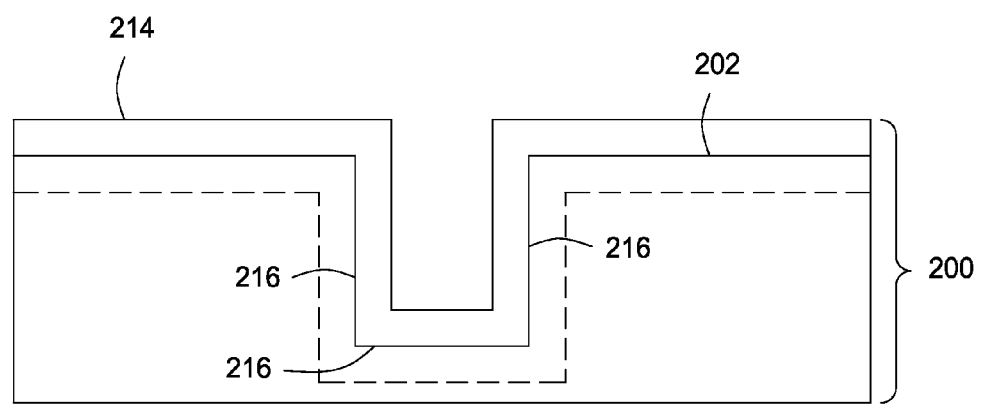

At 104, a conformal layer 214 is formed from a target material on the upper surface 202 of the patterned substrate 200 and on interior surfaces 216 of the at least one feature 204, as illustrated in FIG. 2B. The conformal layer 214 may be formed by sputtering the target material using a first plasma, wherein the first plasma interacts with the target material to reduce the surface energy of the target material such that the sputtered target material wets the upper surface 202 of the patterned substrate and the interior surfaces 216 of the at least one feature to form the conformal layer 214.

The target material may include a conductive material, such as a metal or metal alloy. For example, the target material may include at least one of copper (Cu), magnesium (Mg), manganese (Mn) or Aluminum (Al). In some embodiments, the target material may be copper (Cu). In some embodiments, the target material may be a metal alloy, such as at least one of Cu—Mg, Cu—Mn, or Cu—Al. In some embodiments, a metal alloy, such as at least one of Cu—Mg, Cu—Mn, or Cu—Al may be deposited directly on a dielectric material rather than the barrier layer (conformal second layer 208). In such embodiments, the metal alloy may form a barrier layer with the dielectric material.

The first plasma may be formed from a first process gas comprising a first concentration of hydrogen ($H_2$). For example, the presence of hydrogen ($H_2$) in the first process gas may be utilized to control (e.g., reduce) the surface energy of the target material, such that the target material wets the upper surface 202 of the patterned substrate 200 and the interior surfaces 216 of the at least one feature 204 to form the conformal layer 214. The first process gas may further include one or more inert gases, such as nitrogen (N) or a noble gas, for example, argon (Ar), helium (He), neon (Ne), xenon (Xe), krypton (Kr), or the like. In some embodiments, the first process gas further includes argon (Ar). In some embodiments, the first concentration of hydrogen ($H_2$) can be at least about 10% of a total volume of the first process gas. In some embodiments, the first concentration of hydrogen ($H_2$) may be at least about 10% of the total volume of the first process gas with the balance being one or more of the above inert gases.

Figure 2C:
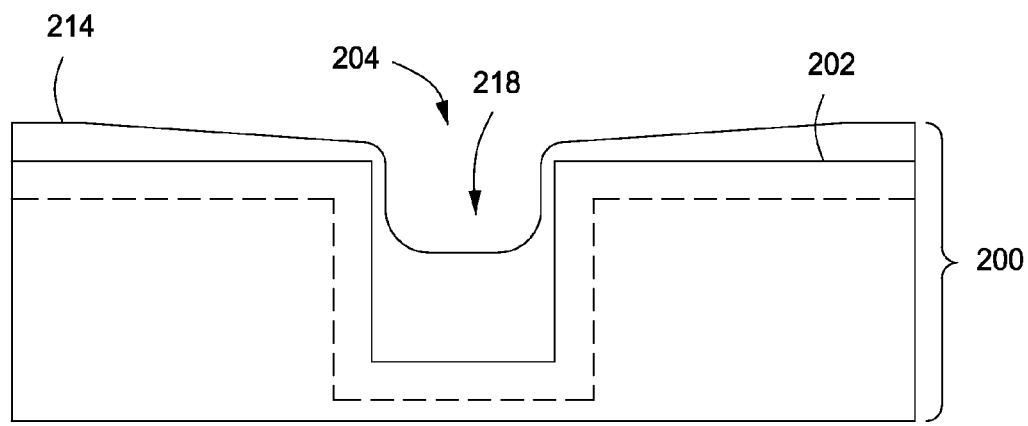
Figure 2D:
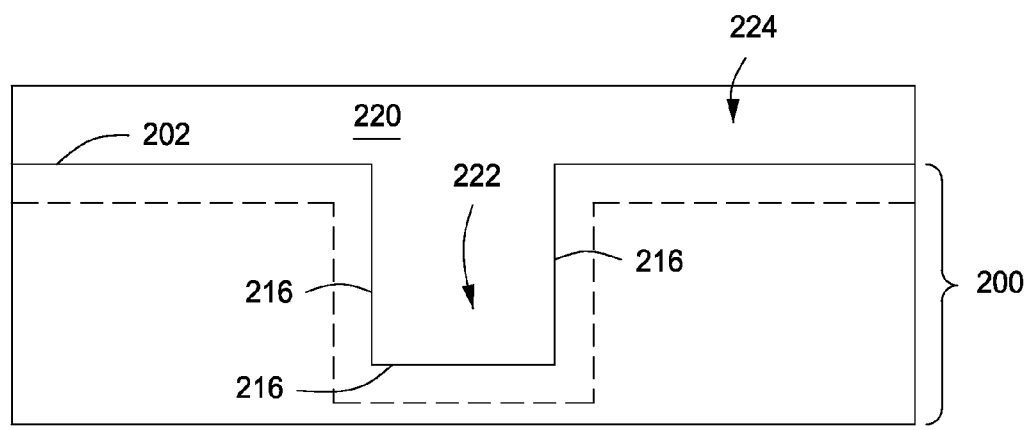

At 106, an interior volume 218 of the at least one feature 204 can be filled with the target material, as illustrated in FIG. 2C. The interior volume 218 of the at least one feature 204 can be filled by sputtering the target material using a second plasma different from the first plasma, wherein the second plasma interacts with the sputtered target material and the deposited conformal layer to increase the surface energy of the sputtered target material and the conformal layer 214 such that at least portions of the conformal layer 214 are pulled into the interior volume 218 of the at least one feature 204 by capillary action.

The second plasma may be formed from a second process gas comprising a second concentration of hydrogen ($H_2$). For example, the presence of hydrogen ($H_2$) in the second process gas may be utilized to control the surface energy of the target material, such the surface energy of the target material, either target material being freshly sputtered at 104 or target material present in the conformal layer 214, can be increased. In some embodiments, the second concentration of hydrogen ($H_2$) in the second process gas can be less than the first concentration of hydrogen ($H_2$) in the first process gas.

The second process gas may include an inert gas, such as nitrogen (N) or a noble gas, for example, argon (Ar), helium (He), neon (Ne), xenon (Xe), krypton (Kr), or the like. In some embodiments, the second process gas further includes argon (Ar). In some embodiments, the second concentration of hydrogen ($H_2$) can be at least about 10% of a total volume of the second process gas. In some embodiments, the second concentration of hydrogen ($H_2$) may be at least about 10% of the total volume of the second process gas with the balance being one or more of the above inert gases.

For example, as shown in FIG. 2C, the increased surface energy in the target material which may be provided by the presence of a lower concentration (e.g., the second concentration) of hydrogen ($H_2$) at 106, may cause at least some portions of the conformal layer 214 to be pulled into the interior volume 218 of the at least one feature 204 to fill the interior volume 218. For example, the at least some portions of the conformal layer 214 may be located on the upper surface 202 of the patterned substrate 200 proximate the at least one feature 204, or along interior surfaces 216 of the at least one feature 204 proximate the upper surface 202 as illustrate in FIG. 2C. As the surface energy increases, these portions of the conformal layer 214 may be drawn into the interior volume 218 of the at least one feature 204 to fill the interior volume 218.

At 108, a deposited layer 220 can be formed from the target material. The deposited layer 220 can include a first portion 222 which fills the interior volume 218 of the at least one feature 204 up to about level with the upper surface 202 of the patterned substrate 200; and a second portion 224 deposited atop the upper surface 202 of the patterned substrate 200 and the first portion 222 of the deposited layer 220.

In some embodiments, the deposited layer 220 can be formed by cyclically repeating the deposition of a conformal layer and drawing of the material into the feature as discussed above with respect to 104 and 106. Steps 104 and 106 may be repeated in the same order or in a different order as initially performed to form the deposited layer 220.

In some embodiments, steps 104 and 106 may be repeated until the interior volume 218 of the at least one feature 204 is filled, or substantially filled, with the target material up to about level with the upper surface 202 of the patterned substrate 200 and then depositing a conformal layer as discussed above at 104 to form the deposited layer 220 to a desired thickness on the upper surface 202 of the patterned substrate 200.

In some embodiments, the patterned substrate 200 may be maintained at a first temperature ranging from about 100 to about 400 degrees Celsius, or ranging from about 200 to about 400 degrees Celsius during 104-108 as described above. In some embodiments, the first temperature can range from about 200 to about 450 degrees Celsius. Alternatively, in some embodiments, the process may begin without heating the substrate, for example, beginning at room temperature. The substrate temperature may then be ramped up to at least about 100 degrees Celsius, or from about 100 to about 400 degrees Celsius, or from about 200 to about 450 degrees Celsius prior to finishing the process (for example, during any one of 104, 106, or 108). Once the deposited layer 220 has been formed, the patterned substrate 200 may be cooled to a second temperature of below about 100 degrees Celsius while continuously flowing a process gas comprising hydrogen ($H_2$). For example, the process gas may be continuously flowed during the cool down to prevent agglomeration of the target material in the deposited layer 220.

Further, other optional embodiments of the method 100 can be performed. For example, the patterned substrate 200 can be pre-treated with a pre-treatment gas comprising hydrogen ($H_2$) prior to depositing the target material on the patterned substrate 200. The pre-treatment gas may be in a plasma or non-plasma state. In embodiments where the pre-treatment gas is in a plasma state, the plasma may be biased towards the patterned substrate 200. In some embodiments, an inert gas, such as argon (Ar) or the like, may be co-flowed with the pre-treatment gas upon completion of the pre-treatment of the substrate to form the first process gas. Alternatively, the first process gas and the pre-treatment gas may be the same, for example, including hydrogen ($H_2$) and an inert gas. Upon completion of the pre-treatment of the substrate, the target material can be deposited on the substrate as described above.

Other optional embodiments of the method 100 can include annealing the deposited layer 220 with an annealing gas comprising hydrogen ($H_2$). For example, the annealing may be utilized to increase mobility of the target material in the deposited layer 220 to fill in any voids remaining in the deposited layer 220. In some embodiments, for example when the deposited layer is deposited with a hydrogen plasma, the annealing process may be a thermal anneal in a non-plasma atmosphere or a plasma anneal. In some embodiments, for example when the deposited layer is deposited without a hydrogen plasma, the annealing process may be a plasma anneal. The plasma used for the anneal may be an in-situ plasma or a remote plasma. In some embodiments, for example, when the second process gas comprises hydrogen ($H_2$) and an inert gas, the flow of inert gas may be reduced (or terminated) to form the annealing gas. Alternatively, the second process gas and the annealing gas may be the same. For example, upon completion of deposition with the second plasma, the second plasma may be extinguished while the flow of the second process gas continues while annealing the deposited layer 220.

Figure 3:
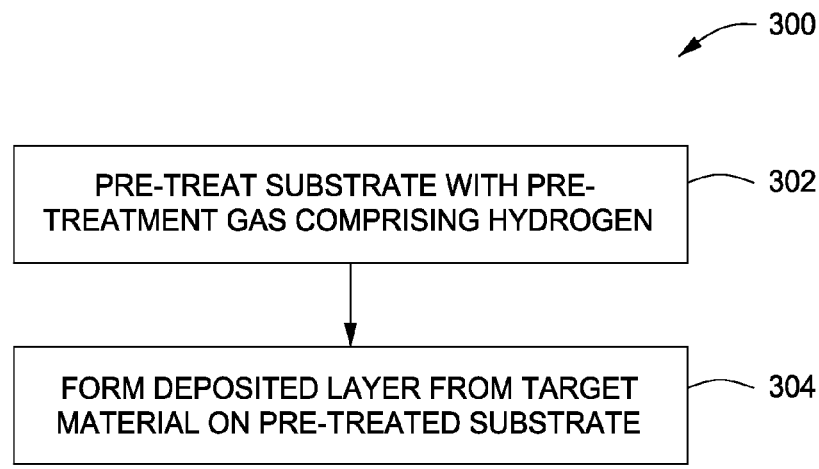
FIG. 3 depicts a flow chart for a method of forming a layer on a substrate in accordance with some embodiments of the present invention.

FIG. 3 depicts a flow chart of a method 300 for forming a layer in accordance with some embodiments of the present invention. The method 300 is described below with respect to the stages of fabrication of a layer on substrate as illustrated in FIGS. 4A-B.

Figure 4A:
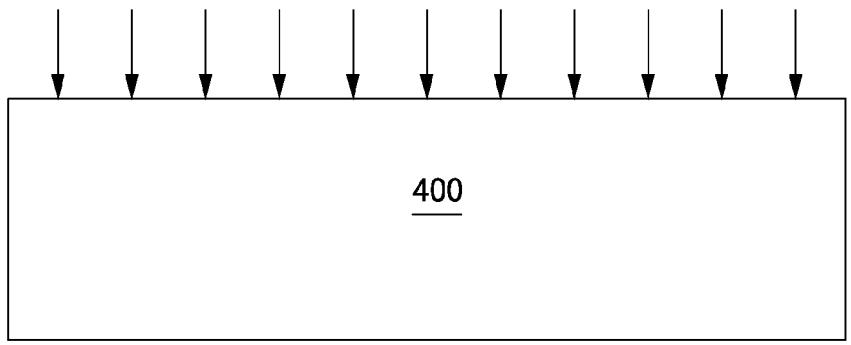
FIGS. 4A-B depict stages of fabrication for a layer formed in accordance with the method of FIG. 3.

The method 300 begins at 302 by pre-treating a substrate 400 with a pre-treatment gas comprising hydrogen ($H_2$) as illustrated in FIG. 4A. For example, the pre-treatment at 302 may be similar to the optional pre-treatment described above for method 100. The pre-treatment, for example, may be utilized to lower the interfacial energy at the upper surface 402 of the substrate 400 such that improved wetting of the surface 402 can be achieved by the target material.

Figure 4B:
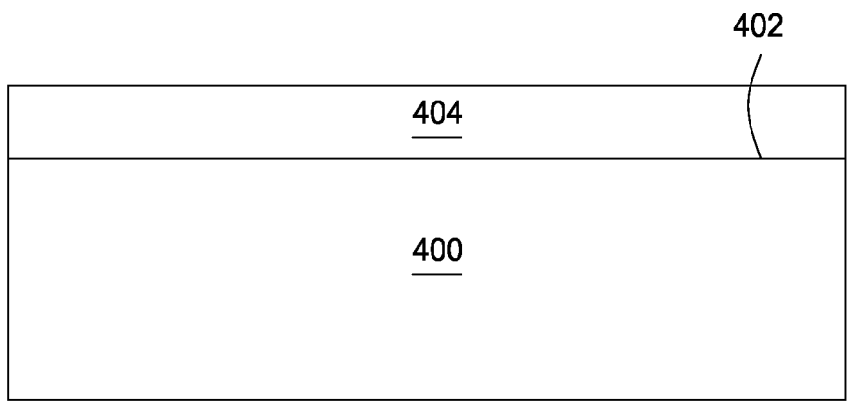

At 304, a deposited layer 404 can be formed from the target material, as depicted in FIG. 4B. For example, the deposited layer 404 can be formed by sputtering the target material using a plasma formed from a process gas comprising hydrogen ($H_2$) to deposit the target material on the pre-treated substrate 400 to form the deposited layer 404. For example, the deposited layer 400 can be formed using any individual or combination of steps to form a deposited layer as discussed above for method 100. Although the deposited layer shown in FIG. 4B is substantially flat, the method 300 may be utilized to deposit a smooth conformal layer atop a substrate and within features formed in the substrate, for example, as discussed above with respect to the conformal layer 214 shown in FIG. 2B. For example, in some embodiments, the method 300 may be utilized as an optional pre-treatment prior to depositing a layer of material in accordance with the method 100, discussed above.

Figure 5:
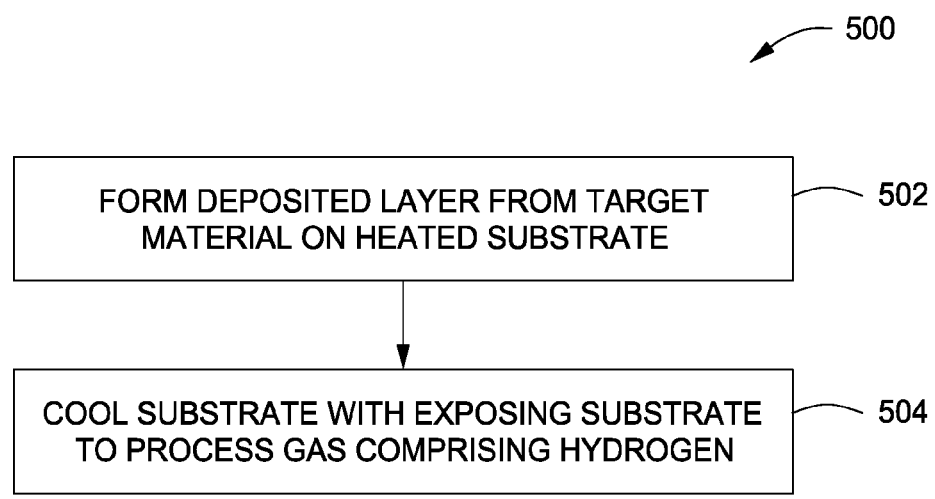
FIG. 5 depicts a flow chart for a method of forming a layer on a substrate in accordance with some embodiments of the present invention.

FIG. 5 depicts a flow chart of a method 500 for forming a layer in accordance with some embodiments of the present invention. The method 500 is described below with respect to the stages of fabrication of a layer on substrate as illustrated in FIG. 4B.

The method 500 begins at 502 by forming the deposited layer 404 from the target material. For example, the deposited layer 404 can be formed by sputtering the target material using a plasma formed from a process gas comprising hydrogen ($H_2$) while maintaining the substrate at the first temperature of about 100 to about 400 degrees Celsius, or ranging from about 200 to about 450 degrees Celsius. Although the deposited layer shown in FIG. 4B is substantially flat, the method 500 may be utilized to deposit a smooth conformal layer atop a substrate and within features formed in the substrate, for example, as discussed above with respect to the conformal layer 214 shown in FIG. 2B.

At 504, once the deposited layer 404 has been formed, the substrate 400 may be cooled to the second temperature of below about 100 degrees Celsius while continuously flowing a process gas comprising hydrogen ($H_2$). For example, the process gas may be continuously flowed during the cool down to prevent agglomeration of the target material in the deposited layer 404. The method 500 may be used to deposit a smooth layer of material on a substrate at a fast rate and without agglomeration of the deposited material. In some embodiments, the method 500 may be utilized as an optional treatment after depositing a layer of material in accordance with the method 100, discussed above.

Other embodiments of the methods disclosed herein are also contemplated. For example, a layer may be deposited as described at 502 in the method 500 while subsequently or simultaneously annealing the deposited layer using hydrogen ($H_2$). For example, combination of the temperature of the substrate (e.g., about 100 to about 400 degrees Celsius, or about 200 to about 400 degrees Celsius) and the hydrogen ($H_2$) present in the first plasma may be used to simultaneously anneal the deposited layer. In some embodiments, a second process gas comprising hydrogen ($H_2$), different from the first process gas utilized for 502, may be provided in a plasma or non-plasma state at a temperature of about 100 to about 400 degrees Celsius, or about 200 to about 400 degrees Celsius, to anneal the deposited layer. The second process gas may differ in hydrogen ($H_2$) concentration and may be tailored (e.g., the hydrogen concentration may be selected) to improve mobility of the target material in the deposited layer to improve uniformity in the deposited layer and/or maximize wetting of the upper surface of the substrate.

Figure 6:
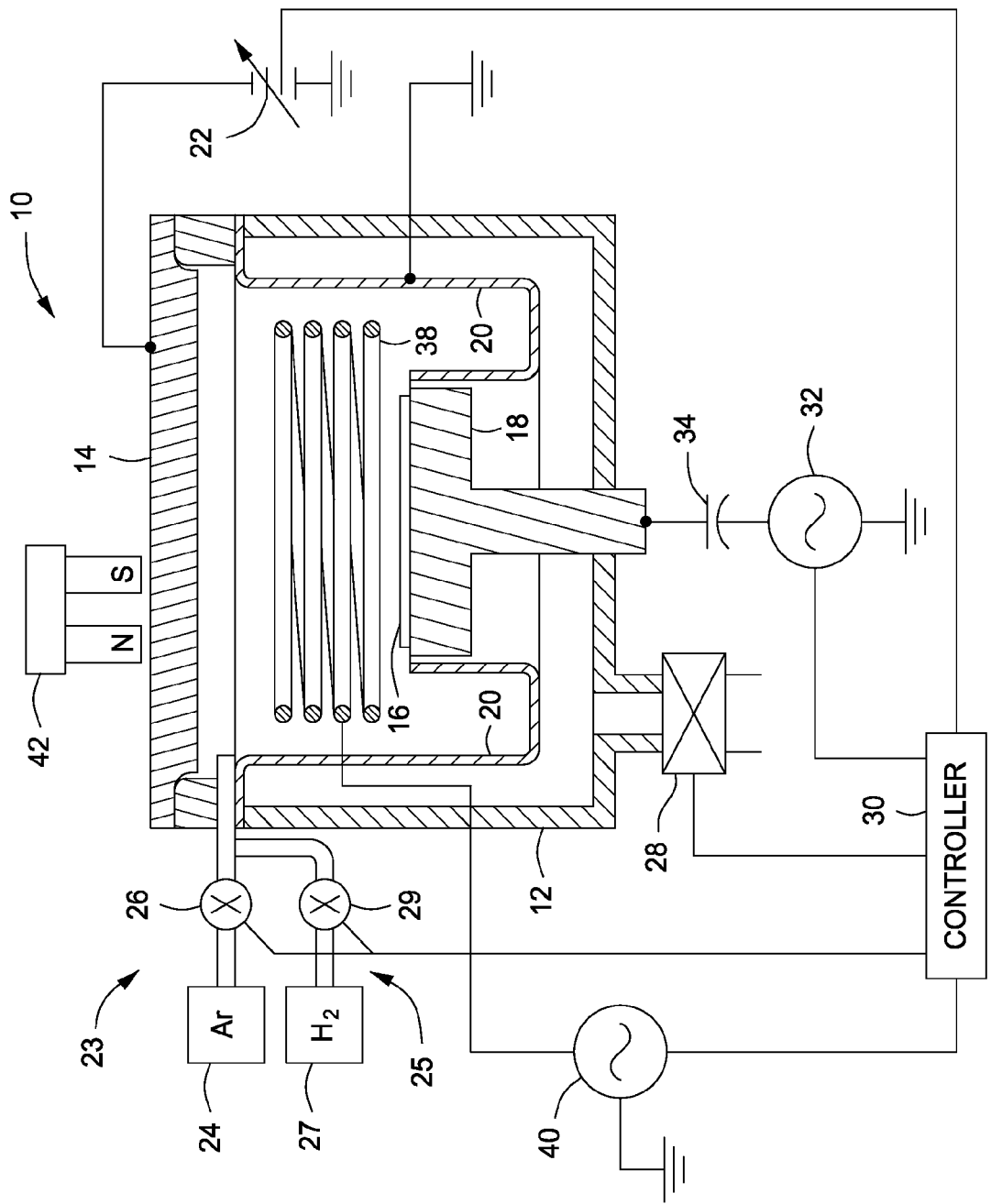
FIG. 6 is a schematic cross-sectional view of a plasma sputtering reactor in accordance with some embodiments of the present invention.

A PVD reactor suitable for use in performing at least portions of the inventive methods discussed above is schematically illustrated in cross-section in FIG. 6. The PVD reactor described below is merely one exemplary embodiment of a reactor than may be utilized with the inventive methods. Other process chamber configurations are possible, for example, such as having a plurality of chambers to perform various method embodiments separately, such as the pretreatment process, the deposition process and the anneal process. For example, each of the plurality of chambers may be stand alone chamber, or part of a multi-chamber processing system, such as a cluster tool or the like. For example, a suitable cluster tool may include one of the CENTURA® line, available from Applied Materials, Inc. of Santa Clara, Calif.

The reactor 10 is of a type sometimes referred to as an SIP (self ionizing plasma) chamber. Reference numeral 10 generally indicates the PVD reactor. The reactor 10 includes a sealable chamber 12, and a target 14 installed at the top of the chamber 12. The target 14 is composed of a material, usually a metal, to be sputter deposited on a wafer 16 held on a pedestal 18. A shield 20 installed within the chamber 12 protects walls of the chamber 12 from material sputtered from the target 14 and provides a grounding anode. A variable (DC) power supply 22 is connected to the target 14 for supplying power thereto.

A gas supply 23, which includes an inert gas source 24 and a first mass flow controller 26, supplies an inert gas (typically the chemically inactive gas argon) to the chamber 12. A second gas supply 25 may be provided, including a hydrogen ($H_2$) gas source 27 and a second mass flow controller 29. The chamber 12 is shown as receiving argon and hydrogen near the top of the chamber 12, but may be reconfigured to receive argon and nitrogen at other locations, such as near the bottom of the chamber 12. A pump 28 is provided to pump out the chamber 12 to a pressure at which sputtering is performed; and an RF power source 32 is connected to the pedestal 18 through a coupling capacitor 34 (e.g., for biasing the wafer 16 during sputtering).

A controller 30 is provided to control operation of the reactor 10. The controller 30 is operatively connected to control the DC power supply 22, the first mass flow controller 26, the second mass flow controller 29, the pump 28, and the RF power supply 32. The controller 30 similarly may be coupled to control the position and/or temperature of the pedestal 18. For example, the controller 30 may control the distance between the pedestal 18 and the target 14, as well as heating and/or cooling of the pedestal 18.

To promote efficient sputtering, a balanced magnetron 42 may be rotationally mounted above the target 14 to shape the plasma. The magnetic field provided by the balanced magnetron 42 does not extend as far into the chamber 12 as the magnetic field provided by an asymmetric magnetron. The reactor 10 may be operated at a pressure of about 10-100 millitorr so that metal atoms sputtered from the target 14 thermalize and have a greater opportunity for ionization. That is, at the higher pressure at which the reactor 10 operates, metal atoms sputtered from the target 14 experience more collisions (have a smaller mean free path between collisions) and due to increased collisions have more random motion or a longer transit time within the plasma of the reactor 10 and thus more opportunity to ionize. Typical ionized metal densities may reach about $10^{10}$ to about $10^{11}$ metal ions/$cm^3$ over a large volume of the reactor 10. Stationary magnetic rings may be used instead of the rotating magnetron 42.

In operation, gas is admitted into the chamber 12 from the gas supply and the DC power supply 22 is turned on to ignite the gas into a plasma. Positive ions thereby are generated, and the target 14 is biased negatively relative to the grounded shield 20. These positively charged ions are attracted to the negatively biased target 14, and may strike the target 14 with sufficient energy to cause target atoms to be sputtered from the target 14. Some of the sputtered atoms strike the wafer 16 and are deposited thereon thereby forming a film of the target material on the wafer 16. More detailed operation is described above with respect to the methods 100, 300, and 500.

A DC self bias of the wafer 16 results from operation of the RF power supply 32, and enhances efficiency of sputter deposition (e.g., by attracting ionized target atoms which strike the wafer 16 with more directionality). As stated, the use of asymmetric magnetic fields increases ionized metal densities. A larger fraction of sputtered target atoms thereby strike the wafer 16 (with greater directionality).

Within the reactor 10, sputtering typically is performed at a pressure of about 10-100 mTorr. Other pressures may be employed. The power applied to the target 14 may be, for example, about 18 kW and the RF bias signal applied to the pedestal 18 may be about 250 W or less (although other target powers and RF biases may be used).

In addition the reactor 10 includes a coil 38 which is disposed within the chamber 12 and surrounds a portion of the interior volume of the chamber 12. The coil 38 may comprise a plurality of coils, a single turn coil, a single turn material strip, or any other similar configuration. The coil 38 is positioned along the inner surface of the chamber 12, between the target 14 and the pedestal 18.

An RF power source 40 is connected to the coil 38 and is controlled by the controller 30. During sputter-deposition operation of the reactor 10, the RF power source 40 is operated to energize the coil 38, to enhance the plasma within the chamber 12 (by ionizing target atoms sputtered from the target 14). The coil 38 typically is energized at about 2 MHz at a power level of 1-3 kW. Other frequencies and/or powers may be used. Because of the energy provided by the coil 38, high metal ion densities may be provided over a wider region of the plasma of the reactor 10 than for a plasma of a reactor not having the coil 38.

Thus, improved methods for forming layers on a substrate have been provided. The inventive methods advantageously control the surface energy of the depositing material, such as a metal or metal alloy, thereby facilitating improved deposition of the material atop surfaces and/or within features at lower temperatures and at faster rates as compared to conventional processes.

While the foregoing is directed to embodiments of the present invention, other and further embodiments of the invention may be devised without departing from the basic scope thereof.

The invention claimed is:

1. A method of forming a layer on a substrate having at least one feature disposed in an upper surface of the substrate, comprising:
   (a) forming a conformal layer on an upper surface of the substrate and interior surfaces of the at least one feature by sputtering a target disposed opposite the substrate using a first plasma that controls a surface energy of sputtered target material such that the sputtered target material wets the upper surface of the substrate and the interior surfaces of the at least one feature to form the conformal layer, wherein the first plasma is formed from a first process gas comprising a first concentration of hydrogen ($H_2$); and
   (b) filling at least a portion of the at least one feature by sputtering the target using a second plasma different from the first plasma to form a deposited layer, wherein the second plasma increases the surface energy of the sputtered target material as compared to the surface energy of sputtered target material from the first plasma, to pull at least portions of the conformal layer into the at least one feature by capillary action, wherein second plasma is formed from a second process gas comprising a second concentration of hydrogen ($H_2$) that is less than the first concentration.

2. The method of claim 1, wherein the first and second process gases further comprise argon (Ar).

3. The method of claim 1, wherein the first concentration of hydrogen ($H_2$) is at least 10 percent of a total volume of the first process gas.

4. The method of claim 1, further comprising:
   pre-treating the substrate with a pre-treatment gas comprising hydrogen ($H_2$) prior to depositing the target material on the substrate.

5. The method of claim 4, further comprising:
   co-flowing an inert gas with the pre-treatment gas upon completion of the pre-treatment of the substrate to form the first process gas.

6. The method of claim 1, further comprising:
   annealing the deposited layer with an annealing gas comprising hydrogen ($H_2$) after filling at least a portion of the at least one feature.

7. The method of claim 6, wherein the second process gas further comprises an inert gas, and further comprising:
   reducing the flow of the inert gas in the second process gas to form the annealing gas.

8. The method of claim 1, where the deposited layer further includes:
   a first portion filling the at least one feature up to about level with the upper surface of the substrate; and
   a second portion deposited atop the upper surface of the substrate and the first portion of the deposited layer.

9. The method of claim 1, further comprising:
   sequentially repeating (a) and (b) to completely fill the feature.

10. The method of claim 9, further comprising:
    repeating (a) after the at least one feature has been filled to form the deposited layer to a desired thickness on the upper surface of the substrate.

11. The method of claim 1, wherein the target material comprises at least one of copper (Cu), magnesium (Mg), manganese (Mn), or Aluminum (Al).

12. The method of claim 1, wherein the substrate further comprises:
    a first layer having the at least one feature disposed in the first layer; and
    a conformal second layer formed atop an upper surface of the first layer and along interior surfaces of the at least one feature.

13. The method of claim 1, further comprising:
    maintaining the substrate at a first temperature ranging from about 100 to about 400 degrees Celsius during (a) and (b); and
    subsequently cooling the substrate below a second temperature of about 100 degrees Celsius while continuously flowing a process gas comprising hydrogen ($H_2$).

14. The method of claim 13, wherein the first temperature ranges from about 200 to about 400 degrees Celsius.

15. The method of claim 1, further comprising:
    ramping the temperature of the substrate from a first temperature of as low as about room temperature to a second temperature of about 100 to about 400 degrees Celsius during (a) or (b).

16. A method of forming a layer on a substrate, comprising:
    pre-treating the substrate with a pre-treatment gas comprising hydrogen ($H_2$);
    sputtering a target disposed opposite the substrate using a first plasma, formed from a first process gas comprising a first concentration of hydrogen ($H_2$) that controls a surface energy of sputtered target material to deposit the target material on the pre-treated substrate to form a layer from the target material; and
    sputtering the target using a second plasma different from the first plasma, and formed from a second process gas comprising a second concentration of hydrogen ($H_2$), wherein the first concentration is greater than the second concentration, to form a deposited layer, wherein the second plasma increases the surface energy of the sputtered target material, as compared to the surface energy of sputtered target material from the first plasma.

17. The method of claim 16, further comprising:
    co-flowing an inert gas with the pre-treatment gas upon completion of the pre-treatment of the substrate to form the process gas.

18. A method of forming a layer on a substrate, comprising:
    sputtering a target disposed opposite the substrate using a plasma comprising an inert gas to form a deposited layer from the target material on the substrate;
    providing hydrogen ($H_2$) to the plasma while sputtering the target and forming the deposited layer on the substrate; and
    heating the substrate to a temperature ranging from about 100 to about 400 degrees Celsius while providing hydrogen ($H_2$) to the plasma to anneal the deposited layer, wherein the deposited layer is deposited and annealed simultaneously.

* * * * *